(12) United States Patent
Knierim

(10) Patent No.: US 8,149,017 B2
(45) Date of Patent: Apr. 3, 2012

(54) LOW-VOLTAGE TO HIGH-VOLTAGE LEVEL TRANSLATION USING CAPACITIVE COUPLING

(75) Inventor: David L. Knierim, Wilsonville, OR (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/823,666

(22) Filed: Jun. 25, 2010

(65) Prior Publication Data

US 2011/0316586 A1    Dec. 29, 2011

(51) Int. Cl.
*H03K 19/0175* (2006.01)
*H03L 5/00* (2006.01)

(52) U.S. Cl. ............... 326/80; 326/62; 326/63; 327/333

(58) Field of Classification Search ............. 326/62–63, 326/68, 80–87
See application file for complete search history.

(56) References Cited

U.S. PATENT DOCUMENTS

| | | | | |
|---|---|---|---|---|
| 5,105,099 | A * | 4/1992 | Routh et al. .................. 327/384 |
| 6,201,429 | B1 * | 3/2001 | Rosenthal ...................... 327/333 |
| 7,019,560 | B2 * | 3/2006 | Wimmer et al. ................ 326/96 |
| 7,046,049 | B2 * | 5/2006 | Deppe ........................... 327/108 |
| 7,724,034 | B2 * | 5/2010 | Tsu et al. ........................ 326/82 |
| 7,782,115 | B2 * | 8/2010 | Ochi .............................. 327/333 |
| 2003/0080780 | A1 * | 5/2003 | Okamoto et al. ................ 326/83 |
| 2006/0186922 | A1 * | 8/2006 | Rozsypal ........................ 326/63 |
| 2010/0073027 | A1 * | 3/2010 | Zhang et al. .................... 326/68 |

* cited by examiner

*Primary Examiner* — Shawki S Ismail
*Assistant Examiner* — Thienvu Tran
(74) *Attorney, Agent, or Firm* — Marger Johnson & McCollom PC

(57) ABSTRACT

A voltage level translator circuit has a digital logic circuit having a digital logic signal, at least one high-voltage capacitor having a first and second connection, wherein one of the first and second connections is electrically coupled to the digital logic signal, and a cross-coupled inverter pair having, the output of at least one inverter of the pair electrically coupled to the other connection of the at least one high-voltage capacitor. A high-voltage driving circuit has two low-voltage input signals, two high-voltage output signals, a first signal being a high-side drive signal and a second signal being a low-side drive signal, two level translators, a first level translator corresponding to the high-side drive signal, and a second level translator corresponding to the low-side drive signal, the level translators including a digital logic circuit having a digital logic signal, at least one high-voltage capacitor having a first and second connection, wherein one of the first and second connections is electrically coupled to the digital logic signal, and a cross-coupled inverter pair having, the output of at least one inverter of the pair electrically coupled to the other connection of the at least one high-voltage capacitor.

15 Claims, 4 Drawing Sheets

LOW-VOLTAGE TO HIGH-VOLTAGE LEVEL TRANSLATION USING CAPACITIVE COUPLING

BACKGROUND

Many types of imaging systems, such as flat panel displays and non-thermal, direct marking print heads require bi-directional drive of many high voltage elements. These imaging systems typically have arrays of imaging elements that form images on displays or on print surfaces by selective turning on and off the imaging elements. High-voltage output transistors generally control the on or off state of the elements by selectively connecting them to either a positive or a negative high voltage supply rail, or to neither.

Generally, low-voltage signals, relative to the driving signals for the imaging elements, control the timing and state of the drive signals. Display and print head driving controllers, or chips, receive relatively low-voltage serial digital bit streams of image data and convert them to parallel data of 96 to 640 bits wide. The driver chips then translate the levels of the low-voltage signals to track the high voltage supply rails and use those level-translated signals to switch high-voltage output transistors that control the on and off state of the imaging elements.

The terms 'low-voltage' and 'high-voltage' used here relate to each other. A 'low-voltage' signal is one used to drive the logic circuitry, generally between 2.5 and 5 V. A 'high-voltage' signal is one that is higher than the voltage used to drive the logic circuitry, such as signals between 10 and 100 V.

Existing driver chips use high-voltage transistors in DC coupled configurations to accomplish this level translation. These high-voltage transistors typically require large isolation areas around each transistor, therefore requiring large areas of the chip substrate such as silicon, increasing the cost of the chip.

One solution lies in the use of capacitively coupled level translation that requires less area and therefore enables lower cost chips. However, existing capacitively coupled isolation circuits generally take up too much area and are too complex to fits hundreds of copies on a single chip.

DETAILED DESCRIPTION OF THE EMBODIMENTS

Figure 1:
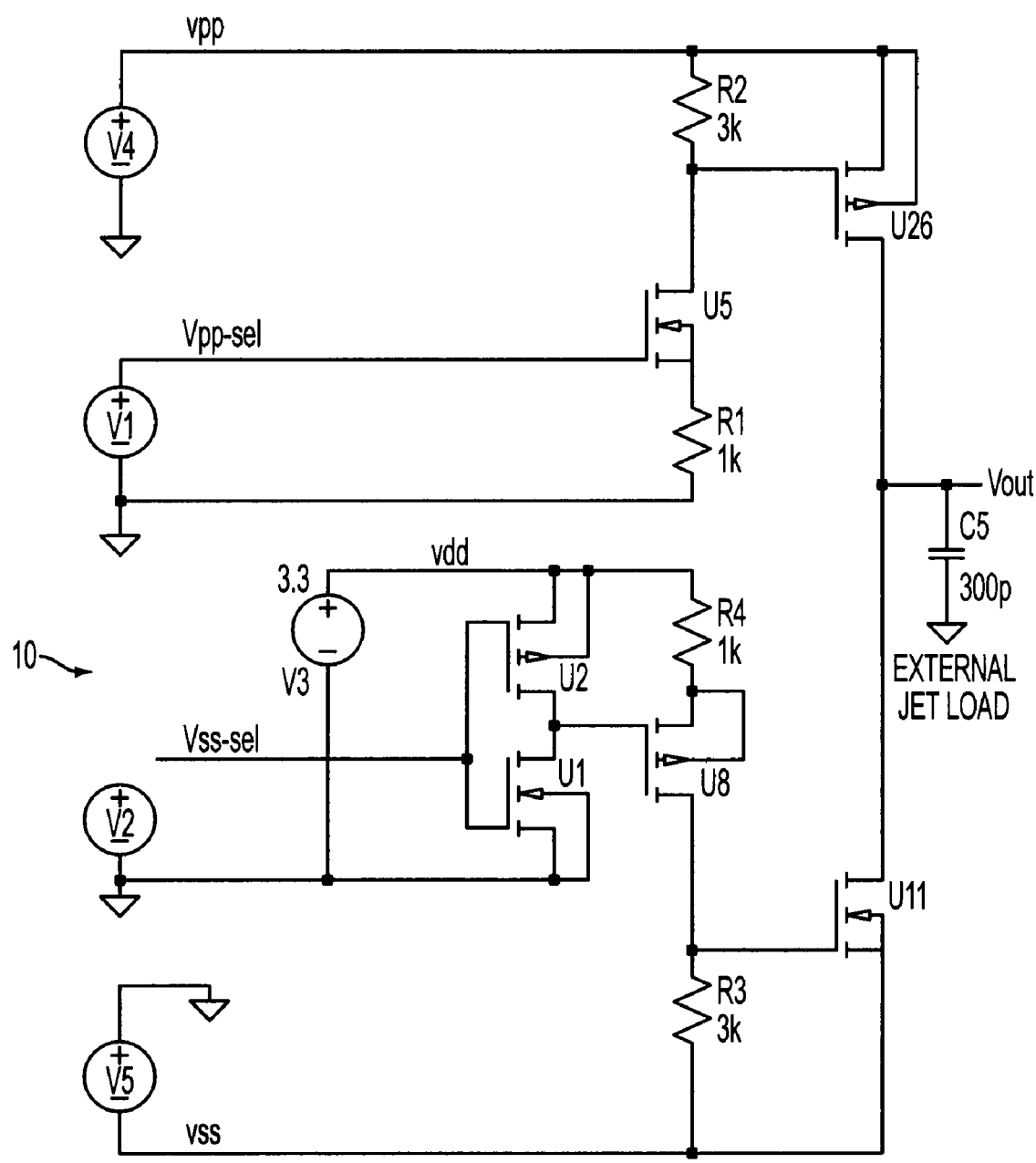
FIG. 1 shows an embodiment of a simplified drive circuit having high-voltage outputs.

FIG. 1 shows a simplified, conceptual circuit diagram for a driver circuit having a high-side output drive signal and a low-side output drive signal. The input signals Vss_sel and Vpp_sel select whether the circuit outputs the high-side rail voltage VPP, or the low-side rail voltage VSS, or is open (high impedance). When Vpp_sel becomes true, the output Vout 16 connects to the high-side rail voltage VPP through PFET 12. Similarly, when the low-side selection signal Vss_sel becomes true, the output Vout connects to the low-side rail voltage VSS through NFET 14. If neither Vpp_sel nor Vss_sel is true, the output Vout is open (high impedance). Generally, the voltage sources VPP and VSS are the high-voltage supply rails at the appropriate voltages to drive the display or imaging device elements, such as the pixels or jets.

Figure 2:
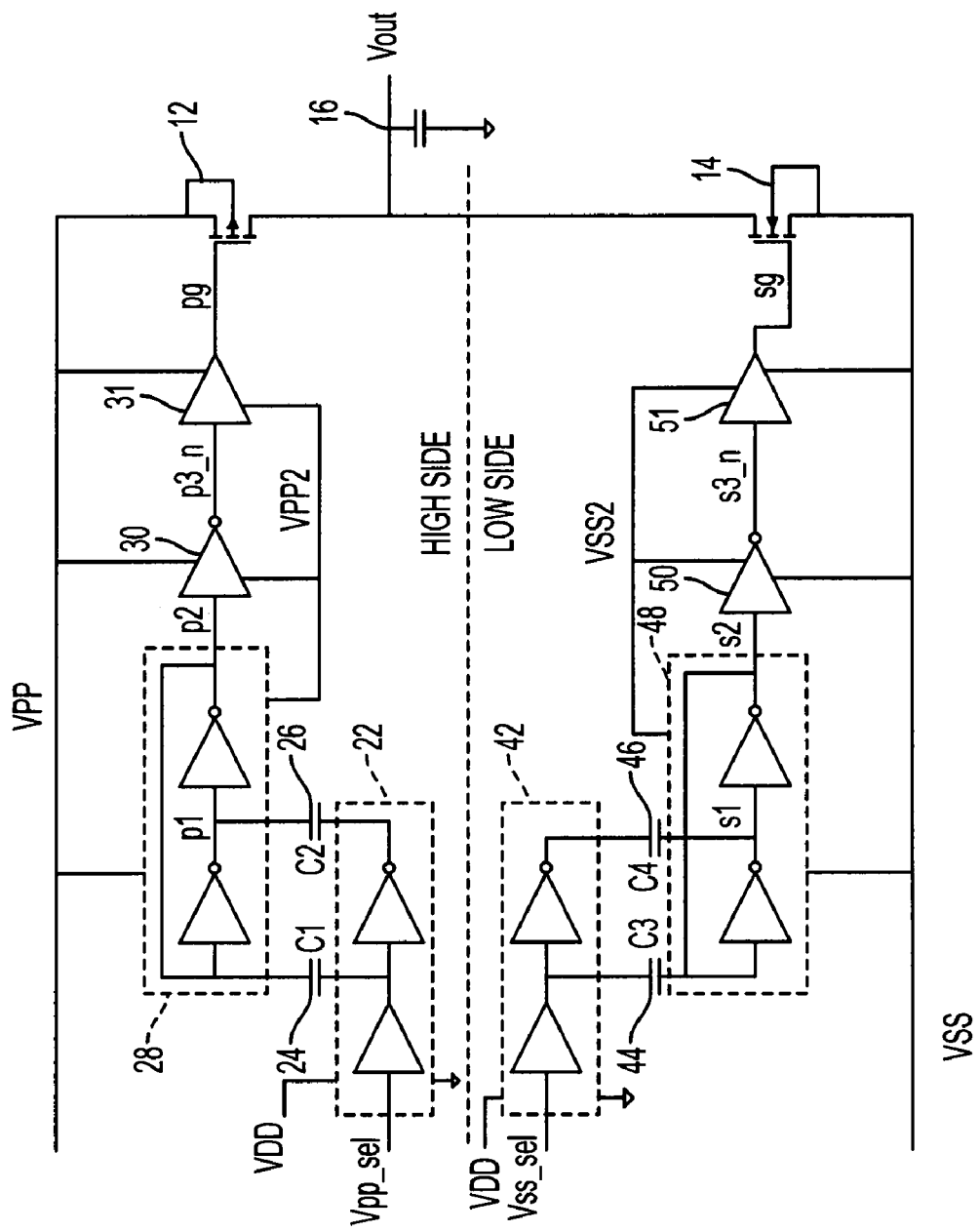
FIG. 2 shows an embodiment of a capacitively-coupled level translator circuit.

The voltage VDD is the low-voltage logic supply voltage that provides power to the logic circuitry. It is logic signals at this voltage that need to be translated high enough to control the high-voltage output FETs 12 and 14. FIG. 2 shows a pair of weak cross-coupled inverters that form a latch 28. The latch state is switched by capacitively coupled current into one or both of the inverter nodes. One should note that while the current diagram shows both nodes being capacitively coupled, it is possible that only one node would be capacitively coupled.

The two capacitors, C1 and C2, referenced as 24 and 26 respectively, receive as inputs the digital logic signals resulting from the logic circuit 22 that responds to the input signal Vpp_sel. The outputs of the capacitors are electrically coupled to the nodes of the inverter pairs. In this embodiment of FIG. 2, the output of capacitor C1 couples to node p1 in the latch circuit 28. The output of capacitor C2 couples to the node p2 in the latch circuit 28. A sensing circuit 30 may sense the state of the latch 28. The output of the sensing circuit 30 is a signal p3_n, which then feeds the output FET 12 through buffer 31. The latch circuit 28, the sensing circuit 30 and the buffer 31 are connected to VPP2, the negative logic supply for these components, where VPP2 tracks approximately 2.5 V below VPP.

The low side output resulting from Vss_sel has counterpart components to the high side. The logic circuit 42 corresponds to the logic circuit 22 and the latch 48 corresponds to the latch 28. Capacitors C3 and C4 correspond to the capacitors C1 and C2, respectively. The operation of the low side circuitry is very similar to the high side circuitry, with the understanding that the final gate drive signal sg is of opposite polarity. Similar to their counterparts in the high side circuitry, the latch circuit 48, the sensing circuit 50 and the buffer 51 would connect to the positive logic supply VSS2, tracking approximately 2.5 V above VSS. The inverter A1, discussed with regard to FIG. 3, on the low side would also connect to this supply.

One issue that may arise with capacitive level translation is the lack of a direct current (DC) path from the level translator input to output. At power-up or after an anomalous event, such as an electrostatic discharge, the input and output of the level translators could end up in different states. Incorrect level translator output states may cause both the high-side output FET 12 and the low-side output FET 14 to turn on simultaneously, which would result in damage to the driver chip. This condition is referred to as cross-conduction.

Figure 3:
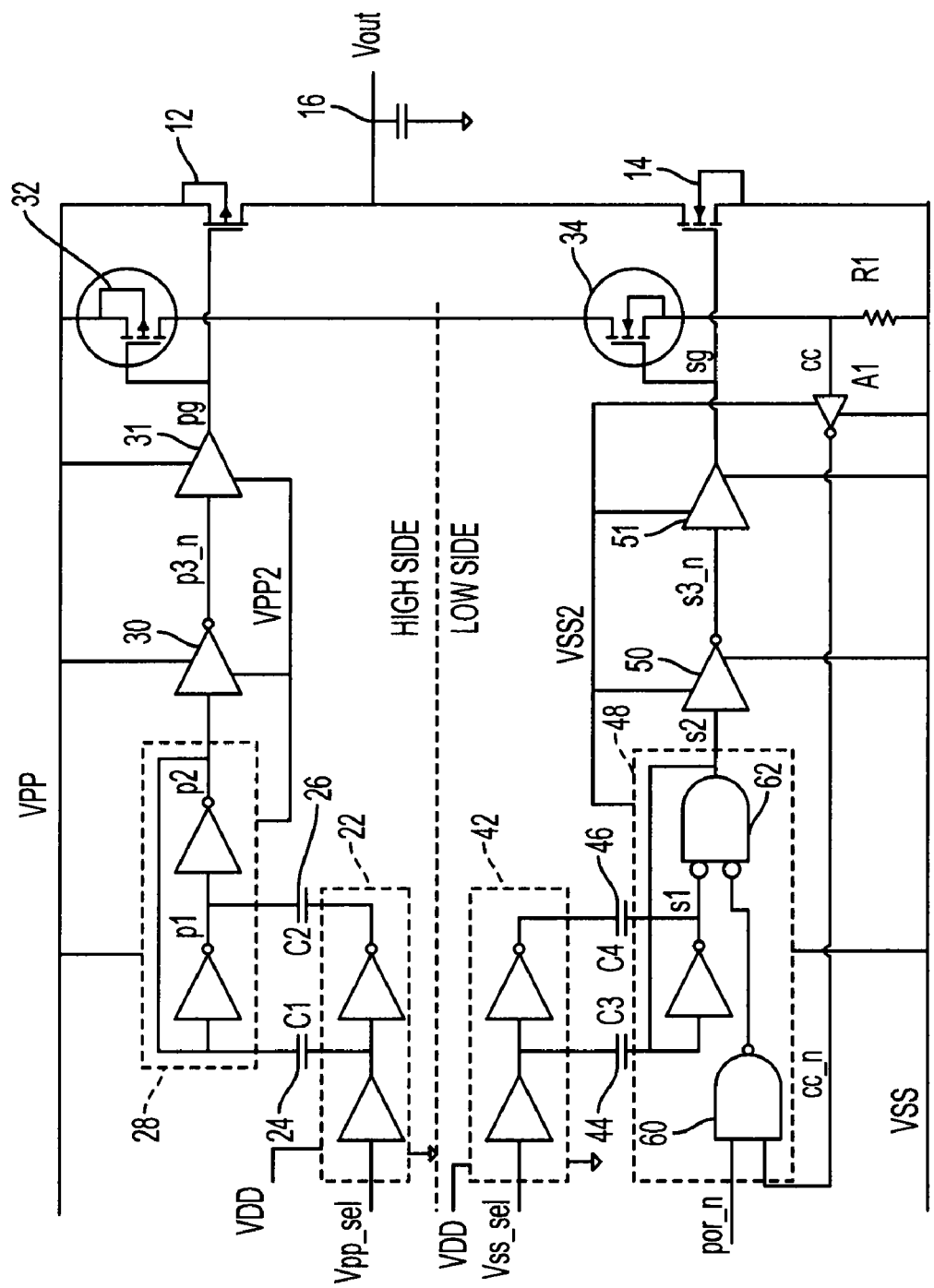
FIG. 3 shows an embodiment of a capacitively-coupled level translator circuit having cross-conduction prevention.

FIG. 3 shows an embodiment of the translator circuit with mechanisms to control this issue. The low-side translator output is configured to reset to the off-state as power is applied to the driver chip. This feature is generally referred to as 'power-on reset.' In addition, a pair of small, high-voltage transistors 32 and 34 are added to each output to detect the simultaneous enabling of the high and low output transistors 12 and 14. This discussion refers to this as "cross-conduction prevention." If simultaneous enabling does occur, the low side of the circuit is immediately set to the off state.

The PFET 32 and the NFET 34, along with resistor R1 and inverter A1, generate a signal cc_n, which is true (low) in the event that cross conduction does occur. The gate 60 receives the cross-conduction signal as one input and a low-true power-on reset signal por_n as the other. Only when both cc_n and por_n are false (high) is the low-side level translator latch 48 allowed to switch to the true (high) state on its output s2 from gate 62. This ensures that the NFET 14 does not turn ON at the same time the PFET 12 is ON. The power-on reset signal ensures that the NFET is OFF when the circuit is initially powered on, also avoiding cross-conduction.

One should note that further level translation may be needed depending upon the semiconductor technologies used. The logic levels for the gates of FETs 12 and 14 may need to increase further than the current circuit, but a conventional level translator may be used, shown as buffers 31 and 51 in FIGS. 2 and 3.

One should note that consideration should be given to any loads on the capacitors. If the input side of one capacitor has a load that the other does not, timing issues may arise. Either removing the load from the inputs of the capacitors, or matching the loads, may be advisable. This allows the timing of the two capacitors to be more closely coupled, as the desire is that the buffers driving the capacitors switch as close to simultaneously as possible. Care should also be taken to minimize stray capacitance on the output side of the capacitors in order to maximize the voltage swing available to switch the states of latches 28 and 48.

Figure 4:
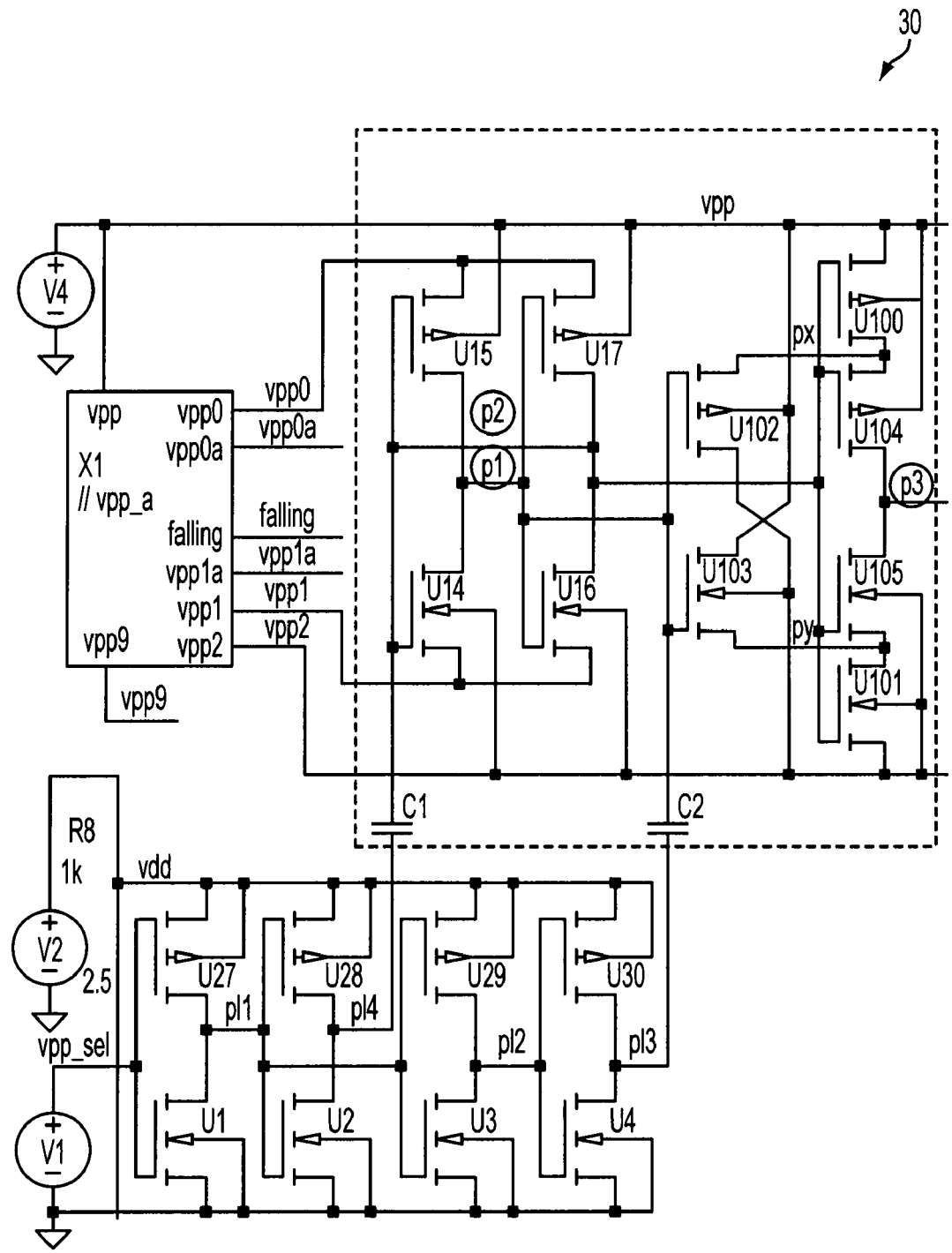
FIG. 4 shows a detailed view of an embodiment of a capacitively-coupled level translator circuit.

The sensing circuit 30 can compare voltages on both nodes p1 and p2, rather than relying on p2 alone, to improve robustness to rapid voltage swings on VPP. FIG. 4 shows a different embodiment of the sensing circuit than that shown as 30 in FIG. 3. In FIG. 4, the nodes of the inverter pairs are again identified as p1 and p2, and they receive the capacitively coupled current from the capacitors.

The output inverter 30 of FIG. 3 has been replaced with transistors U100, 101, 102, 103, 104 and 105. The supply voltages vpp0 and vpp1 are reduced supply voltages for the inverter pairs, referred to here as 'weak' inverters. These transistors form a pseudo-differential receiver to sense the latch state. The output of the receiver is at node p3. This latch sense circuit improves robustness to very rapid slew rates on the high voltage supply rails. While not show in FIG. 4, the level translator circuit including the pseudo-differential sensing circuit is replicated for the low-side high voltage circuits as well.

In this manner, the driver chip can reach the necessary voltage to drive the gates of high-voltage output transistors or circuits using capacitively-coupled inverters rather than the more complex and larger DC coupled circuits. In addition, this circuitry operates much more quickly than the DC coupled circuits and has protection against issues that may arise from AC coupling.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A voltage level translator circuit, comprising:
    a digital logic circuit having a digital logic signal;
    first and second high-voltage capacitors, each having a first and second connection, wherein one of the first and second connections is electrically coupled to the digital logic signal;
    a cross-coupled inverter pair having the output of at least one inverter of the pair electrically coupled to the other connection of at least one of the first and second high-voltage capacitors;
    a sensing circuit configured to sense the state of the cross-coupled inverter pair and to produce an output signal having a voltage level higher than the digital logic signal;
    wherein the second capacitor has the first connection electrically coupled to the digital logic signal and the second connection electrically coupled to an output of the other of the at least one inverter of the pair;
    wherein the electrical coupling of the digital logic signal to the first connection of the second capacitor includes logic inversion.

2. The voltage level translator circuit of claim 1, wherein the at least one inverter of the cross-coupled inverter pair is weak by having high impedance relative to an impedance of the digital logic signal.

3. The voltage level translator circuit of claim 1, wherein the cross-coupled inverter pair receives a reduced supply voltage compared to a supply voltage for the digital logic circuit.

4. The voltage translator circuit of claim 1, further comprising a pseudo-differential receiver circuit arranged to sense a latch state of the cross-coupled inverter pair.

5. A high-voltage driving circuit, comprising:
    two low-voltage input signals;
    two high-voltage output signals, a first signal being a high-side drive signal and a second signal being a low-side drive signal;
    two level translators, a first level translator generating the high-side drive signal, and a second level translator generating the low-side drive signal, the level translators comprising:
        a digital logic circuit having a digital logic signal;
        at least one high-voltage capacitor having a first and second connection, wherein one of the first and second connections is electrically coupled to the digital logic signal; and
        a cross-coupled inverter pair having the output of at least one inverter of the pair electrically coupled to the other connection of the at least one high-voltage capacitor.

6. The high-voltage driving circuit of claim 5, the level translators further comprising a sensing circuit configured to sense the state of the cross-coupled inverter pair.

7. The high-voltage driving circuit of claim 6, the level translators further comprising a buffer configured to buffer an output of the sensing circuit.

8. The high-voltage driving circuit of claim 5, wherein the at least one inverter of the cross-coupled inverter pair is weak by having high impedance relative to an impedance of the digital logic signal.

9. The high-voltage driving circuit of claim 5, wherein the at least one high-voltage capacitor comprises first and second capacitors.

10. The high-voltage driving circuit of claim 9, wherein the second capacitor has a first connection electrically coupled to the digital logic signal and a second connection electrically coupled to an output of the other of the at least one inverter of the pair.

11. The high-voltage driving circuit of claim 10, wherein the electrical coupling of the digital logic signal to the first connection of the second capacitor includes logic inversion.

12. The high-voltage driving circuit of claim 9, further comprising a pseudo-differential receiver circuit arranged to sense a latch state of the cross-coupled inverter pair.

13. The high-voltage driving circuit of claim 5, further comprising a cross-conduction prevention circuit configured to detect simultaneous enabling of both the high-side drive signal and the low-side drive signal.

14. The high-voltage driving circuit of claim 13, wherein an output of the cross-conduction prevention circuit resets an output of one of either the high-side level translator or the low-side level translator to an off state.

15. The high-voltage driving circuit of claim 5, further comprising a power-on reset circuit to reset outputs of one of either the high-side level translator or the low-side level translator to an off state as power is applied to the circuit.

* * * * *